(12) United States Patent
Kitamura

(10) Patent No.: US 6,861,702 B2
(45) Date of Patent: Mar. 1, 2005

(54) SEMICONDUCTOR DEVICE

(75) Inventor: Akio Kitamura, Nagano (JP)

(73) Assignee: Fuji Electric Co., Ltd. (JP)

( * ) Notice: Subject to any disclaimer, the term of this patent is extended or adjusted under 35 U.S.C. 154(b) by 236 days.

(21) Appl. No.: 10/143,732

(22) Filed: May 10, 2002

(65) Prior Publication Data

US 2003/0001202 A1 Jan. 2, 2003

(30) Foreign Application Priority Data

May 11, 2001 (JP) .......................... 2001-141051
Sep. 20, 2001 (JP) .......................... 2001-286517

(51) Int. Cl.$^7$ .............................................. H01L 29/72
(52) U.S. Cl. ................... 257/330; 257/335; 257/336; 257/340; 257/343
(58) Field of Search .................... 257/330, 335, 257/336, 340, 343

(56) References Cited

U.S. PATENT DOCUMENTS

| | | | | |
|---|---|---|---|---|
| 5,844,275 A | * | 12/1998 | Kitamura et al. | ............ 257/335 |
| 2001/0041419 A1 | | 11/2001 | Ito | .............. 438/424 |
| 2001/0055861 A1 | | 12/2001 | Patti et al. | ............. 438/524 |
| 2002/0115270 A1 | | 8/2002 | Wu | ............. 438/484 |
| 2002/0197782 A1 | | 12/2002 | Kitamura | ................... 438/200 |
| 2003/0001202 A1 | | 1/2003 | Kitamura | .................. 257/330 |

FOREIGN PATENT DOCUMENTS

| | | |
|---|---|---|
| JP | 61-260676 | 11/1986 |
| JP | 64-51662 | 2/1989 |
| JP | 2-180074 | 7/1990 |
| JP | 3-4560 | 1/1991 |
| JP | 3-44076 | 2/1991 |
| JP | 5-110072 | 4/1993 |
| JP | 5-190663 A | 7/1993 |
| JP | 5-299648 | 11/1993 |
| JP | 6-97450 | 4/1994 |
| JP | 7-74352 | 3/1995 |
| JP | 9-321291 A | 12/1997 |
| JP | 11-238791 A | 8/1999 |
| JP | 2000-150877 | 5/2000 |
| JP | 2001-36071 | 2/2001 |

* cited by examiner

Primary Examiner—Edward Wojciechowicz
(74) Attorney, Agent, or Firm—Rossi & Associates

(57) ABSTRACT

A lateral MOSFET exhibiting a high breakdown voltage includes a plurality of unit devices formed in a semiconductor substrate; each unit device including a trench, the side face thereof being extended at any angle from 30 degrees to 90 degrees with respect to the surface of trench; an offset drain region surrounding the side face and the bottom face of trench; an insulator filling trench; a gate electrode extended onto trench such that gate electrode works as a field plate; a source electrode extended above trench such that source electrode works as a field plate; and a drain electrode extended above trench such that drain electrode works as a field plate.

30 Claims, 16 Drawing Sheets

SEMICONDUCTOR DEVICE

FIELD OF THE INVENTION

The present invention relates to a semiconductor device. Specifically, the present invention relates to a semiconductor structure which facilitates constructing MOSFET's exhibiting a high breakdown voltage and used for power IC's.

BACKGROUND

Trench-type MOSFET's have been developed. A trench-type MOSFET is a vertical MOSFET which includes trenches and gate electrodes buried in the respective trenches such that channels are formed in the side wall portions of the trenches. The trench-type MOSFET is advantageous to reduce the cell pitch and the on-resistance per a unit area. As far as lateral MOSFET's mountable on power IC's are concerned, some trench-type structures thereof have been proposed. However, the trench-type lateral MOSFET's have not been put into practical use yet.

The trench-type lateral MOSFET's that have been previously proposed include a top-drain-trench-type RESURF DMOS transistor having trenches formed between the sources and the drains thereof and gates formed in the respective trenches (Japanese Unexamined Laid Open Patent Application H06-97450). Another reported trench gate structure buries polycrystalline silicon gates in the trenches formed in the same manner as described above (ISPSD 2000, pp. 47–50). A lateral power transistor proposed includes drains, sources and trenches formed in a substrate, and gates formed on the surfaces of the portions of the substrate between the sources and the trenches, in which channels are formed (Japanese Unexamined Laid Open Patent Application H07-74352).

A transistor has also been proposed that includes trenches formed from the surface of the drain drift region and filled with an insulator or a semi-insulator, and gate electrodes extended onto the trenches (cf. Japanese Unexamined Laid Open Patent Application H08-97441). Furthermore, a transistor, the edge portions of the gate electrodes thereof are above the trenches, has been proposed (cf. ISPSD 1999, pp. 73–76).

The transistor disclosed in the Japanese Unexamined Laid Open Patent Application H06-97450 is manufactured in the following way. The oxide films formed on the inner walls of the trenches are selectively oxidized to form non-uniform oxide layers. Then, gate oxide films are formed by wet-etching the thin oxide layers. Finally, trenches are filled with gate polycrystalline silicon. As described above, the transistor disclosed in the Japanese Unexamined Laid Open Patent Application H06-97450 is manufactured through a complicated manufacturing process including many steps.

The transistor having a trench gate structure and reported in the ISPSD 2000 exhibits a low breakdown voltage of lower than 20 V. This transistor has been proposed to reduce the channel resistance, which is the predominant component of the on-resistance thereof. Since the source electrode and the drain electrode of the transistor reported in the ISPSD 2000 do not exhibit any field plate effect as FIG. 1 described in the report of the ISPSD 2000 indicates, the reported trench gate structure is not suitable for obtaining a transistor exhibiting a breakdown voltage of the several hundreds volt class.

Since the source electrode and the drain electrode of the transistor disclosed in the Japanese Unexamined Laid Open Patent Application H07-74352 do not exhibit any field plate effect as FIG. 2 of the above identified publication indicates, this transistor is not suitable for obtaining a breakdown voltage of 200 V or higher.

In the transistor disclosed in Japanese Unexamined Laid Open Patent Application H08-97441, the extension of the gate electrodes above the trenches thereof may exhibits field plate effects. However, the source electrode and the drain electrode of this transistor do not exhibit any field plate effect as FIG. 1 of the above identified publication indicates. Therefore, the transistor disclosed in Japanese Unexamined Laid Open Patent Application H08-97441 is not suitable for obtaining a breakdown voltage of 200 V or higher.

Since the source electrode and the drain electrode of the transistor disclosed in the report of the ISPSD 1999 do not exhibit any field plate effect, this transistor is not suitable for obtaining a breakdown voltage of 200 V or higher.

Since the surface impurity concentration in the device exhibiting a breakdown voltage of the 700 V class is low, the ions contained in the mold resin may adversely affect the device characteristics. Specifically, the device characteristics may be deteriorated by the reliability tests conducted in a high-temperature and high humidity environment due to the ions contained in the mold resin.

In view of the foregoing, it would be desirable to provide a semiconductor structure which facilitates providing a lateral trench-type MOSFET exhibiting a high breakdown voltage of 200 V or higher and preventing the manufacturing steps thereof from greatly increasing. It would further be desirable to provide a semiconductor structure which facilitates providing a lateral trench-type MOSFET exhibiting a breakdown voltage of the 700 V class and preventing the ions in the mold resin from adversely affecting the device characteristics thereof.

SUMMARY OF THE INVENTION

According to a first aspect of the invention, there is provided a semiconductor device including a plurality of unit devices formed in a Si substrate, each of the unit devices including a trench, the side face thereof being extended at any angle from 30 degrees of angle to 90 degrees of angle with the substrate surface; an offset drain region surrounding the side face and the bottom face of the trench; an insulator filling the trench; a gate electrode extended onto the trench; a source electrode; and a drain electrode; the source electrode and the drain electrode being extended above the trench.

Since the source electrode and the drain electrode extended above the trench work as field plates, the electric field inside the semiconductor device is relaxed, and a high breakdown voltage is obtained. Since the offset drain region can be doped heavily by virtue of the field plate effect, the tradeoff relation between the breakdown voltage and the on-resistance per a unit area is reduced. Moreover, since the spacing between the source electrode and the drain electrode above the trench is narrowed, the ions in the mold resin are prevented from adversely affecting the device characteristics.

According to a second aspect of the invention, there is provided a semiconductor device including a plurality of unit devices formed in a Si substrate, each of the unit devices including a trench; an offset drain region surrounding the side face and the bottom face of the trench; an insulator filling the trench; and one or more field plates working as a field plate or field plates in the insulator. Since a field plate or field plates are disposed in the insulator filling the trench, the breakdown voltage in the OFF-state of the semiconductor device is improved. Since the offset drain region can be doped heavily by virtue of the provision of the field plate or the field plates, the tradeoff relation between the breakdown voltage and the on-resistance per a unit area is reduced.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS OF THE INVENTION

Now the invention will be explained in detail hereinafter with reference to the accompanied drawing figures which illustrate the preferred embodiments of the invention. In the accompanied drawing figures, the important constituent elements are not drawn exactly on the bases of the dimensions described in the figures but exaggerated more or less for the sake of easy understanding. Although the first conductivity type is a p-type and the second conductivity type is an n-type in the following descriptions, the invention is applicable to the semiconductor device, in which the first conductivity type is an n-type and the second conductivity type a p-type.

First Embodiment

Figure 1:
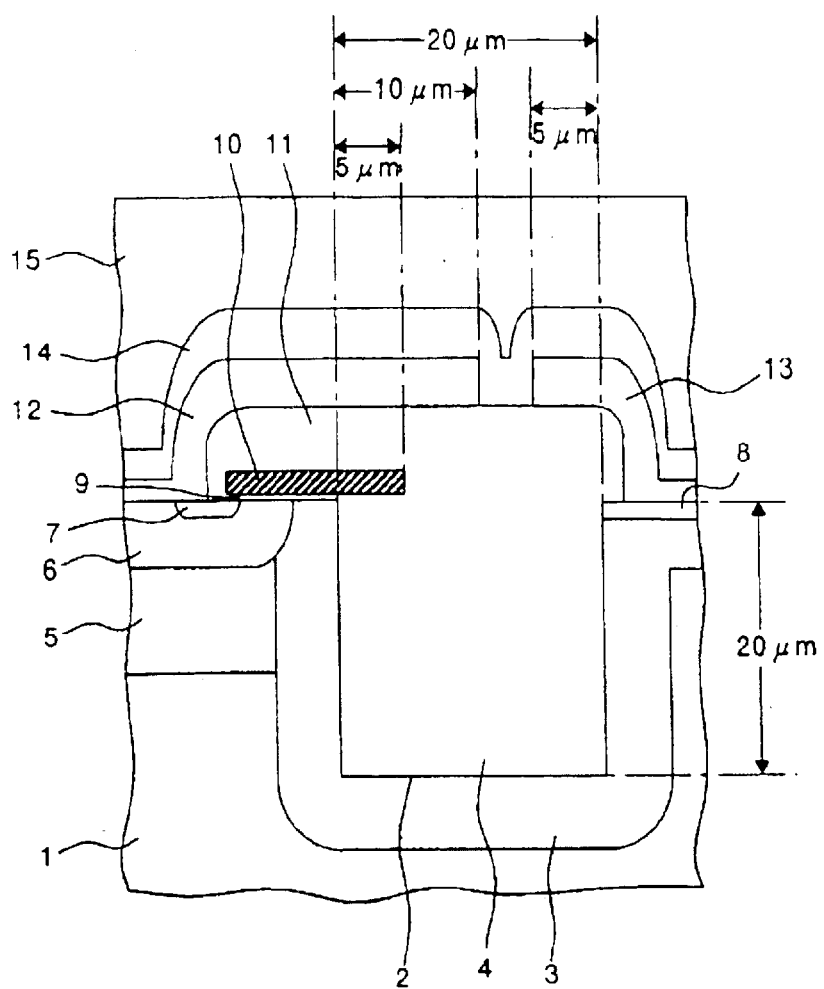
FIG. 1 is a cross sectional view of a semiconductor device according to a first embodiment of the invention.

FIG. 1 is a cross sectional view of a semiconductor device according to a first embodiment of the invention. The semiconductor device according to the first embodiment is a lateral trench-type MOSFET, which includes a plurality of unit devices formed in a p-type substrate 1. Each unit device includes a trench 2, an n$^-$-type offset drain region 3 working as a drain drift region, an insulator 4 buried in trench 2, a p-type well region 5, a p-type base region 6, an n$^+$-type source region 7, an n$^+$-type drain region 8, a gate insulation film 9 made of an oxide, a polycrystalline silicon gate electrode 10, an interlayer insulation film 11, a source electrode 12, a drain electrode 13, a passivation film 14, and a mold resin 15.

Trench 2 is in the surface portion of substrate 1. Trench 2 is dug from the surface of substrate 1 and filled with an insulator 4. The n$^-$-type offset drain region 3 surrounds the side face and the bottom face of trench 2. The p-type well region 5 is adjacent to n$^-$-type offset drain region 3 in the surface portion of semiconductor substrate 1 on the source side of trench 2. The p-type base region 6 is in the surface portion of p-type well region 5. The n$^+$-type source region 7 is in the surface portion of p-type base region 6. The n$^+$-type source region 7 is spaced apart from n$^-$-type offset drain region 3. The n$^+$-type drain region 8 is in the surface portion of n$^-$-type offset drain region 3 on the drain side, opposite to the source side, of trench 2.

Gate insulation film 9 is on n$^+$-type source region 7 and the source side surface of n$^-$-type offset drain region 3. Gate electrode 10 is formed on gate insulation film 9 and extended onto trench 2 in parallel to the substrate surface. Interlayer insulation film 11 covers gate electrode 10 and trench 2. Source electrode 12 is in electrical contact with p-type base region 6 and n$^+$-type source region 7. Source electrode 12 is formed along the surface of interlayer insulation film 11 and extended above trench 2 in parallel to the substrate surface. Drain electrode 13 is in electrical contact with n$^+$-type drain region 8. Drain electrode 13 is formed along the surface of interlayer insulation film 11 and extended above trench 2 in parallel to the substrate surface. Source electrode 12 and drain electrode 13 are spaced apart and insulated from each other. Passivation film 14 covers the entire semiconductor device described above. Mold resin 15 seals the entire semiconductor device described above in air-tight.

Typical parameters of the constituent elements described above are described below. The specific resistance of semiconductor substrate 1 is around 100 Ωcm. Trench 2 is 20 μm in width and 20 μm in depth. The side face of trench 2 is at right angles with the substrate surface. The surface impurity concentration of n$^-$-type offset drain region 3 is from $5 \times 10^{15}$ cm$^{-3}$ to $5 \times 10^{16}$ cm$^{-3}$. The n$^-$-type offset drain region 3 is around 6 μm in depth. The extension of gate electrode 10 onto trench 2 is 5 μm. The extension of source electrode 12 above trench 2 is 10 μm. The extension of drain electrode 13 above trench 2 is 5 μm. Gate electrode 10, source electrode 12 and drain electrode 13 formed as described above exhibit a field plate function. The breakdown voltage of the semiconductor device structured as described above is around 800 V.

In the semiconductor device structured as described above, the electric field is prevented from localizing to the portion of n$^-$-type offset drain region 3 in the vicinity of the side face of trench 2 on the source side, since the extended gate electrode 10 exhibits a field plate effect and since depletion of n$^-$-type offset drain region 3 is promoted by p-type base region 6 and p-type well region 5. The device pitch is around 40 μm based on the above described dimensions of the constituent elements. The n⁻-type offset drain region 3 can be doped heavily considering the field plate effect. Therefore, the on-resistance per a unit area of the semiconductor device according to the first embodiment is about half the on-resistance per a unit area of the conventional semiconductor device by virtue of the reduced device pitch and the heavily doped n⁻-type offset drain region 3.

The semiconductor device shown in FIG. 1 is manufactured in the following way. A p-type well region 5 having the same dimensions with those of the p-type well in the not shown logic section is formed in the surface portion of a p-type semiconductor substrate 1, the specific resistance thereof is 100 Ωcm. A trench 2, 20 μm in width and 20 μm in depth, is formed by photo-etching in the surface potion of p-type well region 5. Polycrystalline silicon doped with an n-type impurity is deposited in trench 2. An n⁻-type offset drain region 3, the surface impurity concentration thereof is from $5 \times 10^{15}$ cm⁻³ to $5 \times 10^{16}$ cm⁻³ and the depth (xj) thereof is around 6 μm, is formed uniformly around the side face and in the bottom of trench 2 by thermally diffusing the n-type impurity contained in the polycrystalline silicon. Then, the polycrystalline silicon is removed by etching and an oxide film, which will be an insulator 4, is deposited in trench 2.

A gate insulation film 9 is formed. Polycrystalline silicon is deposited on gate insulation film 9 and a gate electrode 10 is formed by etching the deposited polycrystalline silicon. Gate electrode 10 is formed such that the drain-side peripheral portion thereof is extended for 5 μm onto trench 2. A p-type base region 6 and an n⁺-type source region 7 are formed in the surface portion of p-type well region 5 by the self-alignment technique using the other peripheral portion (source side peripheral portion) of gate electrode 10 such that p-type base region 6 surrounds the side face and the bottom of n⁺-type source region 7. An n⁺-type drain region 8 is formed at the same time with or independently of n⁺-type source region 7 in the surface portion of n⁻-type offset drain region 3 on the other side of trench 2. An interlayer insulation film 11 is deposited. Then, a source electrode 12 and a drain electrode 13 are formed on interlayer insulation film 11 such that source electrode 12 is extended for 10 μm above trench 2 and drain electrode 13 is extended for 5 μm above trench 2. Finally, a passivation film 14 is formed on the semiconductor structure formed as described above by depositing a nitride film by plasma deposition, and the semiconductor structure with passivation film 14 deposited thereon is sealed in a mold resin. The semiconductor device according to the first embodiment is manufactured by adding the step of forming trench 2 and the step of filling trench 2 with insulator 4 to the steps for manufacturing the conventional lateral DMOSFET. Thus, the semiconductor device according to the first embodiment is manufactured without employing any difficult step.

The semiconductor device according to the first embodiment of the invention exhibits a high breakdown voltage of 800 V, since the electric field inside the device is relaxed by the field plate function which gate electrode 10, source electrode 12 and drain electrode 13 exhibit. Since offset drain region 3 can be doped heavily by virtue of the field plate effect, the tradeoff relation between the breakdown voltage and the on-resistance per a unit area is reduced by the semiconductor device according to the first embodiment. According to the first embodiment, a semiconductor device exhibiting a high breakdown voltage of the 800 V class is obtained without greatly increasing the manufacturing steps. Since the spacing between source electrode 12 and drain electrode 13 above trench 2 is narrowed to 5 μm according to the first embodiment, the ions in the mold resin are prevented from adversely affecting n-type offset drain region 3.

Second Embodiment

Figure 2:
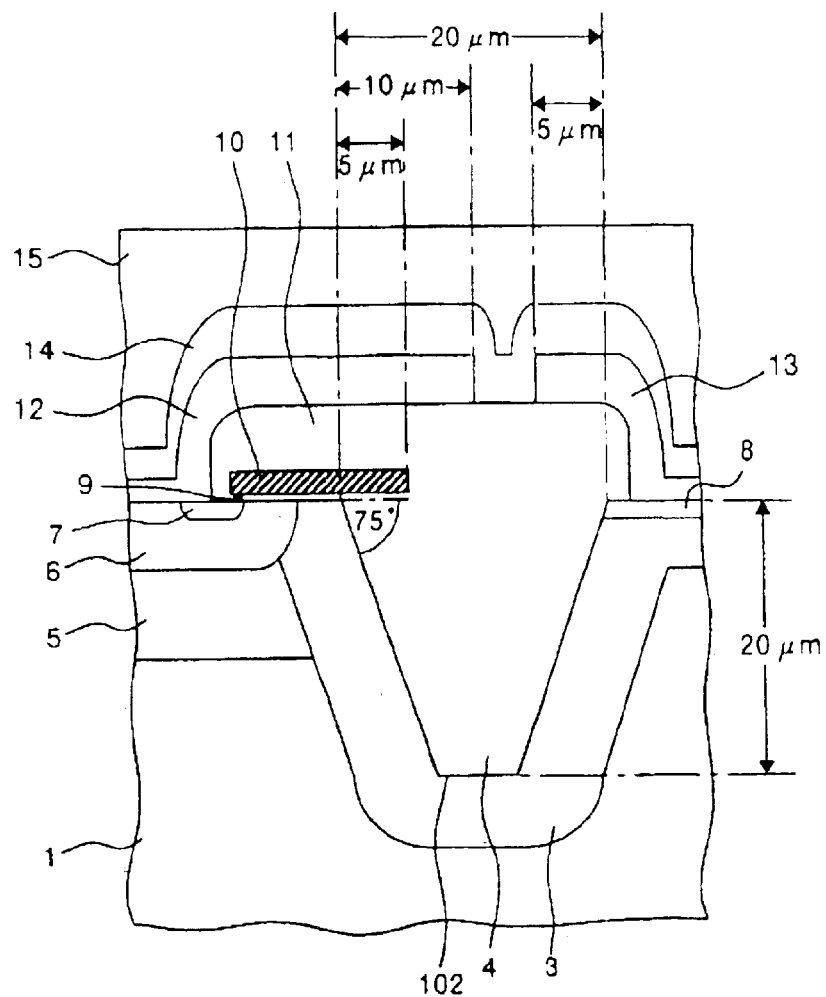
FIG. 2 is a cross sectional view of a semiconductor device according to a second embodiment of the invention.

FIG. 2 is a cross sectional view of a semiconductor device according to a second embodiment of the invention. Referring now to FIG. 2, the semiconductor device according to the second embodiment includes a plurality of unit devices, each including a trench 102, the side face thereof is at around 75 degrees of angle with the substrate surface, in substitution for trench 2 according to the first embodiment of the invention. Typical parameters of the constituent elements of the semiconductor device according to the second embodiment are described below, although they are not always limited to the described ones. The width of trench 102 in the substrate surface is 20 μm. The depth of trench 102 is 20 μm. Trench 102 becomes narrower toward the bottom thereof. The specific resistance of semiconductor substrate is 100 Ωcm. The n⁻-type offset drain region 3 is around 6 μm in depth. The surface impurity concentration of n⁻-type offset drain region 3 is from $5 \times 10^{15}$ cm³ to $5 \times 10^{16}$ cm³. Gate electrode 10 is extended for 5 μm onto trench 102, source electrode 12 for 10 μm above trench 102, and drain electrode 13 for 5 μm above trench 102 such that these electrodes exhibit a field plate function.

When the parameters of the constituent elements are those described above, the breakdown voltage of the semiconductor device according to the second embodiment is around 700 V. The device pitch is around 40 μm based on the above described dimensions of the constituent elements. The n⁻-type offset drain region 3 can be doped heavily considering the field plate effect. Therefore, the on-resistance per a unit area of the semiconductor device according to the second embodiment is about half the on-resistance per a unit area of the conventional semiconductor device by virtue of the reduced device pitch and the heavily doped n⁻-type offset drain region 3. Since the constituent elements other than the trench of the semiconductor device according to the second embodiment are the same with those of the semiconductor device according to the first embodiment, the same reference numerals as used in describing the semiconductor device according to the first embodiment are used to designate the same constituent elements and their duplicated explanations are omitted for the sake of simplicity.

The semiconductor device according to the second embodiment of the invention exhibits a high breakdown voltage of 700 V, since the electric field inside the device is relaxed by the field plate function which gate electrode 10, source electrode 12 and drain electrode 13 exhibit. Since offset drain region 3 can be doped heavily by virtue of the field plate effect, the tradeoff relation between the breakdown voltage and the on-resistance per a unit area is reduced by the semiconductor device according to the second embodiment. According to the second embodiment, a semiconductor device exhibiting a high breakdown voltage of 700 V is obtained without greatly increasing the manufacturing steps in the same manner as the semiconductor device according to the first embodiment. Since the spacing between source electrode 12 and drain electrode 13 above trench 2 is narrowed to 5 μm according to the second embodiment, the ions in the mold resin are prevented from adversely affecting n⁻-type offset drain region 3.

Third Embodiment

Figure 3:
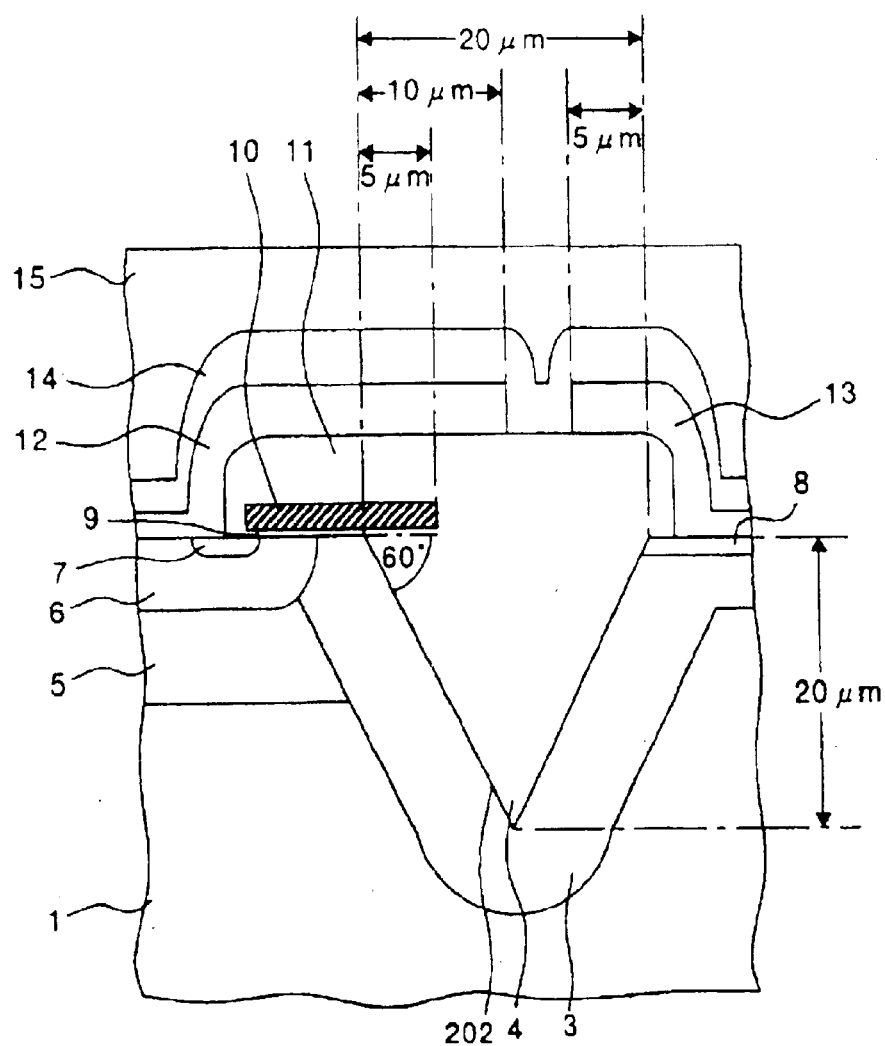
FIG. 3 is a cross sectional view of a semiconductor device according to a third embodiment of the invention.

FIG. 3 is a cross sectional view of a semiconductor device according to a third embodiment of the invention. Referring now to FIG. 3, the semiconductor device according to the third embodiment includes a plurality of unit devices, each including a trench 202, the side face thereof is at around 60 degrees of angle with the substrate surface, in substitution for trench 2 according to the first embodiment of the invention. Typical parameters of the constituent elements of the semiconductor device according to the third embodiment are described below, although they are not always limited to the described ones. The width of trench 202 in the substrate surface is 20 μm. The depth of trench 202 is 20 μm. Trench 202 becomes narrower toward the bottom thereof and does not have any substantial bottom face. The specific resistance of semiconductor substrate is 100 Ωcm. The n⁻-type offset drain region 3 is around 6 μm in depth. The surface impurity concentration of n-type offset drain region 3 is from $5 \times 10^{15}$ cm⁻³ to $5 \times 10^{16}$ cm⁻³.

Gate electrode 10 is extended for 5 μm onto trench 202, source electrode 12 for 10 μm above trench 202, and drain electrode 13 for 5 μm above trench 202 such that these electrodes exhibit a field plate function. When the parameters of the constituent elements are those described above, the breakdown voltage of the semiconductor device according to the third embodiment is around 600 V. The breakdown voltage of the semiconductor device according to the third embodiment is lower than those of the semiconductor devices according to the first and second embodiments, since n⁻-type offset drain region 3 according to the third embodiment is shorter than n⁻-type offset drain region 3 according to the first embodiment or the second embodiment. The device pitch is around 40 μm based on the above described dimensions of the constituent elements. The n⁻-type offset drain region 3 can be doped heavily considering the field plate effect. Therefore, the on-resistance per a unit area of the semiconductor device according to the third embodiment is about half the on-resistance per a unit area of the conventional semiconductor device by virtue of the reduced device pitch and the heavily doped n⁻-type offset drain region 3. Since the constituent elements other than the trench of the semiconductor device according to the third embodiment are the same with those of the semiconductor device according to the first embodiment, the same reference numerals as used in describing the semiconductor device according to the first embodiment are used to designate the same constituent elements and their duplicated explanations are omitted for the sake of simplicity.

The semiconductor device according to the third embodiment of the invention exhibits a high breakdown voltage of 600 V, since the electric field inside the device is relaxed by the field plate function which gate electrode 10, source electrode 12 and drain electrode 13 exhibit. Since offset drain region 3 can be doped heavily by virtue of the field plate effect, the tradeoff relation between the breakdown voltage and the on-resistance per a unit area is reduced by the semiconductor device according to the third embodiment. According to the third embodiment, a semiconductor device exhibiting a high breakdown voltage of 600 V is obtained without greatly increasing the manufacturing steps in the same manner as the semiconductor device according to the first embodiment. Since the spacing between source electrode 12 and drain electrode 13 above trench 202 is narrowed to 5 μm according to the third embodiment, the ions in the mold resin are prevented from adversely affecting n⁻-type offset drain region 3.

Fourth Embodiment

Figure 4:
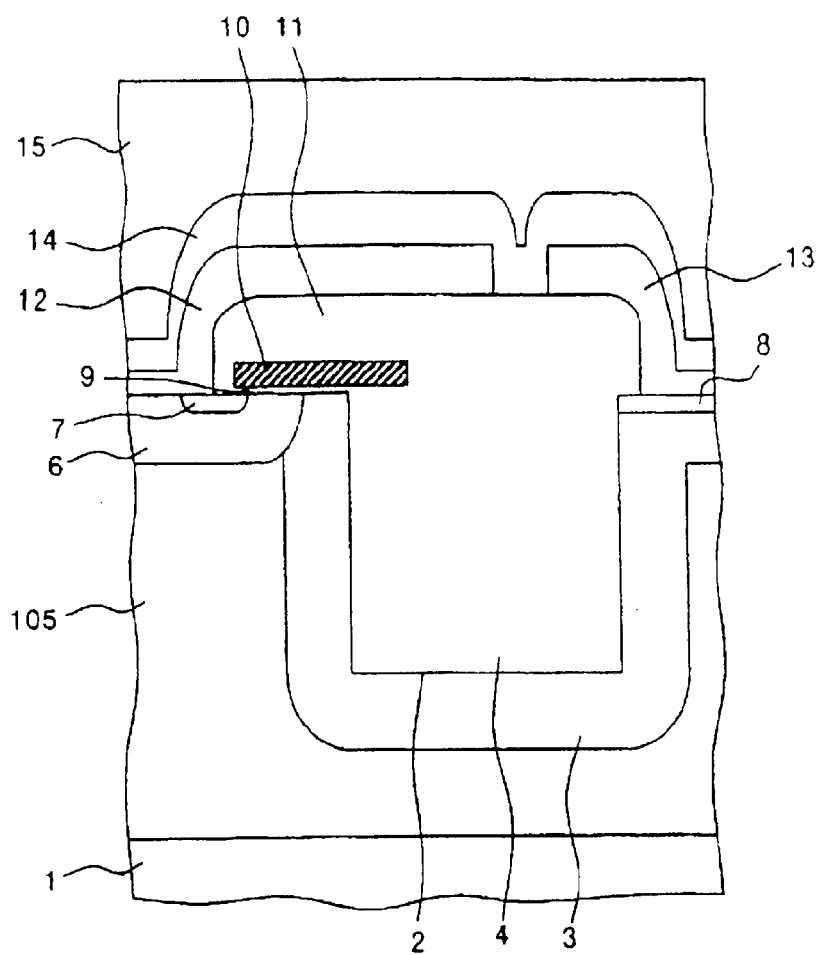
FIG. 4 is a cross sectional view of a semiconductor device according to a fourth embodiment of the invention.

FIG. 4 is a cross sectional view of a semiconductor device according to a fourth embodiment of the invention. Referring now to FIG. 4, the unit device of the semiconductor device according to the fourth embodiment includes a uniform p-type epitaxial growth layer 105 formed in the surface portion of a semiconductor substrate 1 in substitution for p-type well 5 of the semiconductor device according to the first embodiment. A trench 2 and an n⁻-type offset drain region 3 are formed in p-type epitaxial growth layer 105. Exemplary, the impurity concentration in p-type epitaxial growth layer 105 is $2 \times 10^{14}$ cm⁻³ to $2 \times 10^{15}$ cm⁻³. In FIG. 4, the side face of trench 2 is extended at right angles with the substrate surface.

Exemplary, trench 2 is 20 μm in width and 20 μm in depth. Alternatively, the side face of trench 2 may be at 75 degrees of angle with the substrate surface as according to the second embodiment or at 60 degrees of angle with the substrate surface as according to the third embodiment. Exemplary, gate electrode 10 is extended for 5 μm onto trench 2, source electrode 12 for 10 μm above trench 2, and drain electrode 13 for 5 μm above trench 2. Since the constituent elements other than the epitaxial growth layer of the semiconductor device according to the fourth embodiment are the same with those of the semiconductor device according to the first embodiment, the same reference numerals as used in describing the semiconductor device according to the first embodiment are used to designate the same constituent elements and their duplicated explanations are omitted for the sake of simplicity.

The semiconductor device according to the fourth embodiment exhibits the same effects as the semiconductor device according to the first embodiment does. In addition, the semiconductor device according to the fourth embodiment facilitates promoting depletion of the portion of n⁻-type offset drain region 3 in the vicinity of the side face of trench 2 on the source side. Due to the merits which the semiconductor device according to the fourth embodiment exhibits, n⁻-type offset drain region 3 can be doped more heavily. Therefore, the semiconductor device according to the fourth embodiment facilitates further reducing the on-resistance per a unit area without sacrificing the breakdown voltage.

Fifth Embodiment

Figure 5:
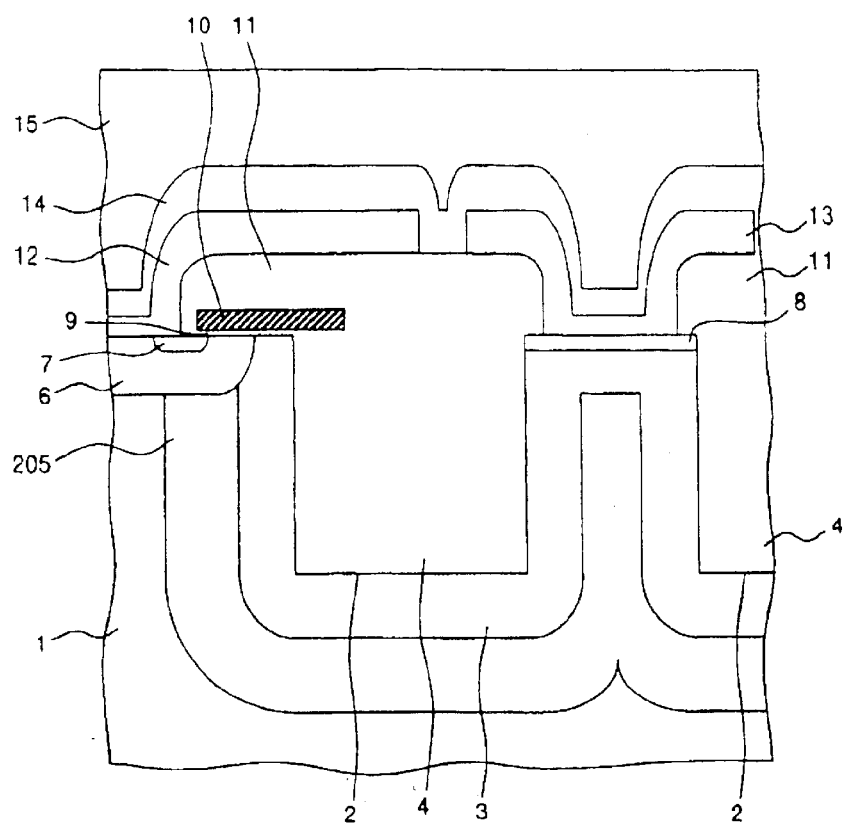
FIG. 5 is a cross sectional view of a semiconductor device according to a fifth embodiment of the invention.

FIG. 5 is a cross sectional view of a semiconductor device according to a fifth embodiment of the invention. Referring now to FIG. 5, the unit device of the semiconductor device according to the fifth embodiment includes, in substitution for p-type well region 5 of the semiconductor device according to the first embodiment, a p-type well region 205 surrounding n⁻-type offset drain region 3. Exemplary, the side face of trench 2 is extended at right angles with the substrate surface. Exemplary, trench 2 is 20 μm in width and 20 μm in depth. Alternatively, the side face of trench 2 may be at 75 degrees of angle with the substrate surface as according to the second embodiment or at 60 degrees of angle with the substrate surface as according to the third embodiment. Exemplary, gate electrode 10 is extended for 5 μm onto trench 2, source electrode 12 for 10 μm above trench 2, and drain electrode 13 for 5 μm above trench 2. Since the constituent elements other than p-type well region 205 of the semiconductor device according to the fifth embodiment are the same with those of the semiconductor device according to the first embodiment, the same reference numerals as used in describing the semiconductor device according to the first embodiment are used to designate the same constituent elements and their duplicated explanations are omitted for the sake of simplicity.

The semiconductor device according to the fifth embodiment exhibits the same effects as the semiconductor device according to the first embodiment does. In addition, the semiconductor device according to the fifth embodiment facilitates promoting depletion of the entire n⁻-type offset drain region 3. Due to the merits which the semiconductor device according to the fifth embodiment exhibits, n⁻-type offset drain region 3 can be doped furthermore heavily.

Therefore, the semiconductor device according to the fifth embodiment facilitates further reducing the on-resistance per a unit area without sacrificing the breakdown voltage.

Sixth Embodiment

Figure 6:
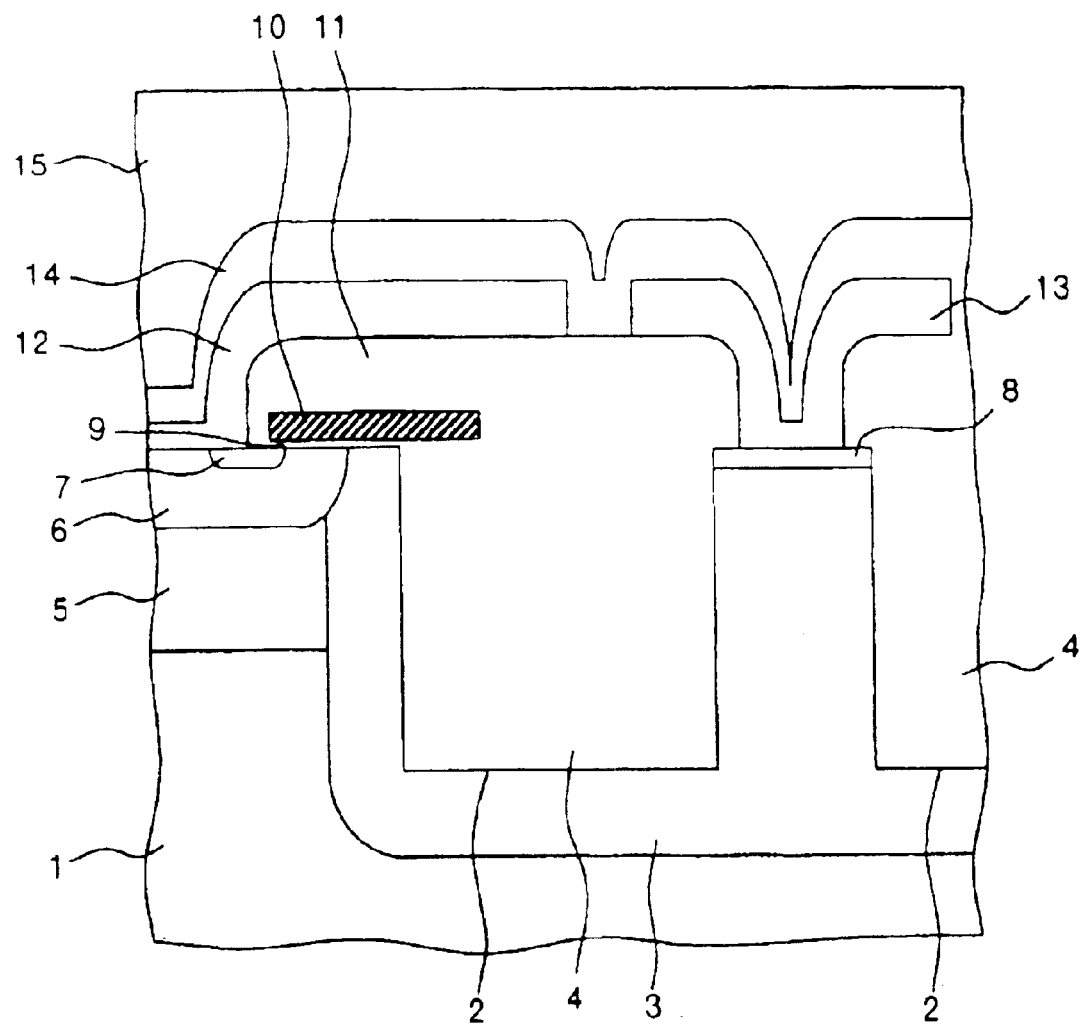
FIG. 6 is a cross sectional view of a semiconductor device according to a sixth embodiment of the invention.

FIG. 6 is a cross sectional view of a semiconductor device according to a sixth embodiment of the invention. Referring now to FIG. 6, only an n-type offset drain region 3 exists between the side faces of adjacent trenches 2 and 2 on the drain side. In contrast, an n⁻-type offset drain region 3 and a semiconductor substrate 1 exist between the side faces of adjacent trenches 2 and 2 on the drain side in the semiconductor device according to the first embodiment. Exemplary, the side face of trench 2 is extended at right angles with the substrate surface.

Exemplary, trench 2 is 20 $\mu$m in width and 20 $\mu$m in depth. Alternatively, the side face of trench 2 may be at 75 degrees of angle with the substrate surface as according to the second embodiment or at 60 degrees of angle with the substrate surface as according to the third embodiment. Exemplary, gate electrode 10 is extended for 5 $\mu$m onto trench 2, source electrode 12 for 10 $\mu$m above trench 2, and drain electrode 13 for 5 $\mu$m above trench 2. Since the structures other than the structure below the drain electrode of the semiconductor device according to the sixth embodiment are the same with those of the semiconductor device according to the first embodiment, the same reference numerals as used in describing the semiconductor device according to the first embodiment are used to designate the same constituent elements and their duplicated explanations are omitted for the sake of simplicity.

The semiconductor device according to the sixth embodiment exhibits the same effects as the semiconductor device according to the first embodiment does. In addition, the semiconductor device according to the sixth embodiment facilitates narrowing the device pitch, since n⁺-type drain region 8 is narrowed. Therefore, the semiconductor device according to the sixth embodiment facilitates further reducing the on-resistance per a unit area without sacrificing the breakdown voltage.

Seventh Embodiment

Figure 7:
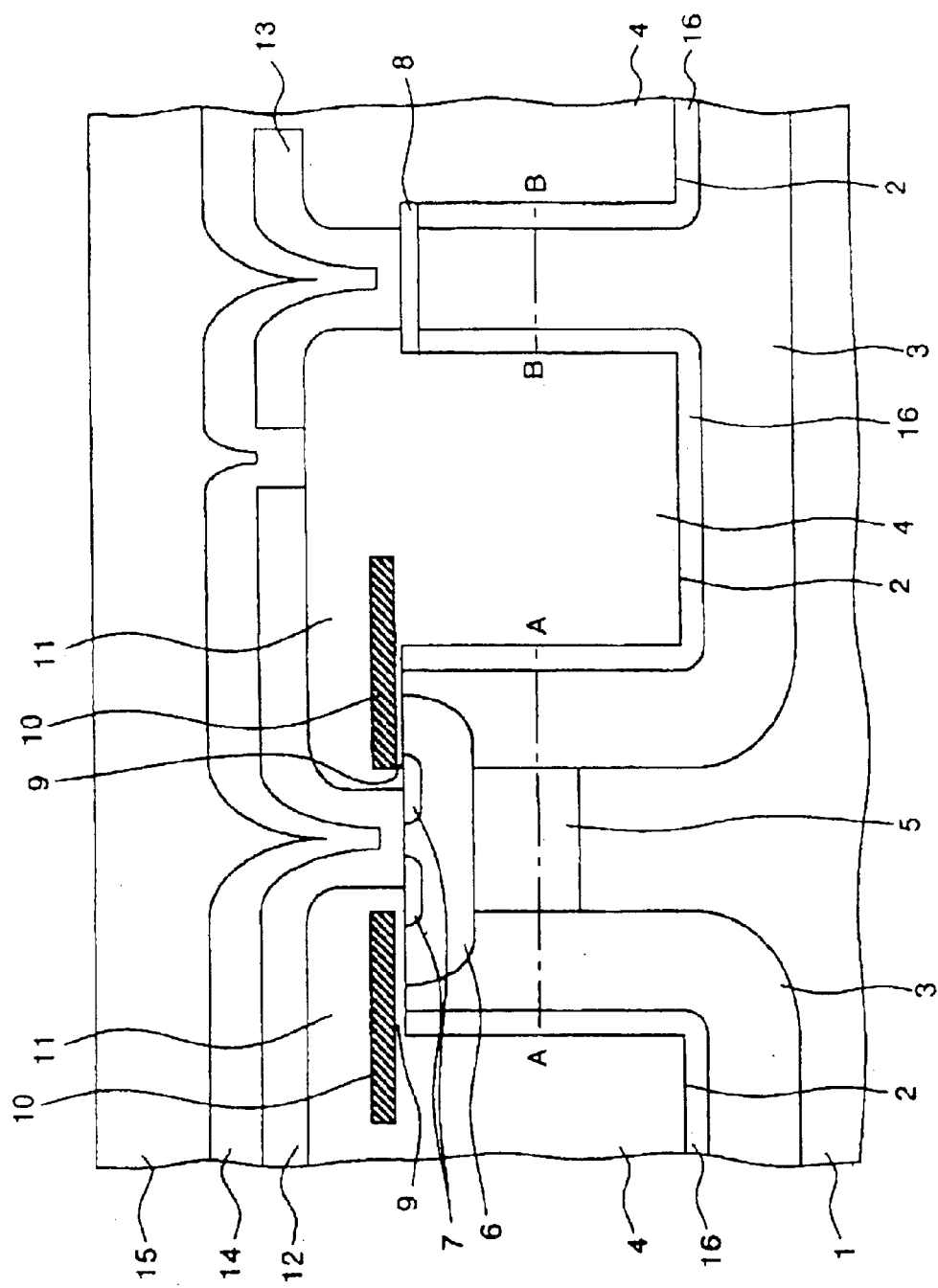
FIG. 7 is a cross sectional view of a semiconductor device according to a seventh embodiment of the invention.

FIG. 7 is a cross sectional view of a semiconductor device according to a seventh embodiment of the invention. Referring now to FIG. 7, the semiconductor device according to the seventh embodiment includes only an n⁻-type offset drain region 3 between the side faces of adjacent trenches 2 and 2 on the drain side and a p⁻-type electric field relaxation layer 16 formed in the surface portion of n⁻-type offset drain region 3 in contact with insulator 4 in trench 2. Exemplary, the surface impurity concentration in p⁻-type electric field relaxation layer 16 is $1\times10^{16}$ cm⁻³ to $1\times10^{17}$ cm⁻³. Exemplary, the side face of trench 2 is extended at right angles with the substrate surface.

Exemplary, trench 2 is 20 $\mu$m in width and 20 $\mu$m in depth. Alternatively, the side face of trench 2 may be at 75 degrees of angle with the substrate surface as according to the second embodiment or at 60 degrees of angle with the substrate surface as according to the third embodiment. Exemplary, gate electrode 10 is extended for 5 $\mu$m onto trench 2, source electrode 12 for 10 $\mu$m above trench 2, and drain electrode 13 for 5 $\mu$m above trench 2. Since the structure other than the structure below the drain electrode and the provision of p⁻-type electric field relaxation layer 16 according to the seventh embodiment are the same with those of the semiconductor device according to the first embodiment, the same reference numerals as used in describing the semiconductor device according to the first embodiment are used to designate the same constituent elements and their duplicated explanations are omitted for the sake of simplicity.

Figure 8:
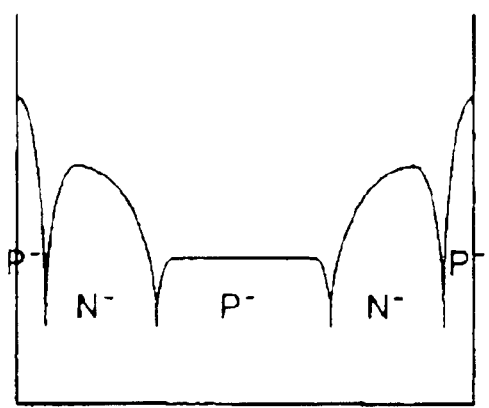
FIG. 8 is an impurity distribution profile along the line segment A—A of FIG. 7.
Figure 9:
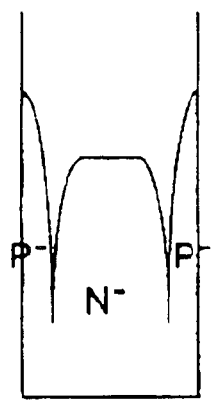
FIG. 9 is an impurity distribution profile along the line segment B—B of FIG. 7.

The semiconductor device according to the seventh embodiment exhibits the same effects same as those the semiconductor device according to the first embodiment exhibits and additional effects described below. FIG. 8 is an impurity distribution profile along the line segment A—A of FIG. 7. FIG. 9 is an impurity distribution profile along the line segment B—B of FIG. 7. As the impurity distribution profile described in FIG. 8 indicates, a p⁻/n⁻/p⁻/n⁻/p⁻ quintuple layer structure exists on the source side of trench 2. As the impurity distribution profile described in FIG. 9 indicates, a p⁻/n⁻/p⁻ triple layer structure exists on the drain side of trench 2. Since depletion layers expand from the pn-junctions in the multiple layer structures due to the reduced surface electric field (RESURF) effect, the multiple layer structures described above facilitate heavily doping the constituent diffusion layers. Therefore, n⁻-type offset drain region 3 can be doped furthermore heavily. The heavily doped n⁻-type offset drain region 3 facilitates reducing the on-resistance per a unit area. The same effects as described above are obtained in the semiconductor devices according to the foregoing embodiments. For example, n⁻/p⁻/n⁻ triple layer structures exist on the source side and on the drain side of trench 2 in the semiconductor device according to the first embodiment of the invention.

Eighth Embodiment

Figure 10:
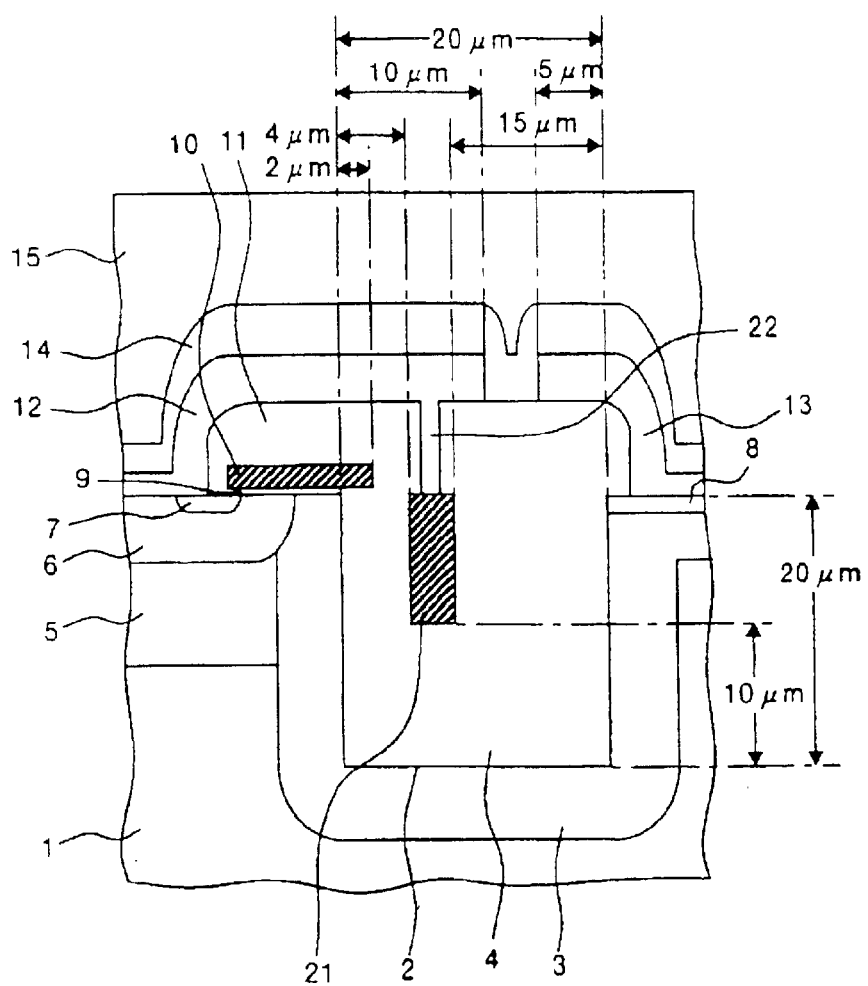
FIG. 10 is a cross sectional view of a first semiconductor device according to an eighth embodiment of the invention.

FIG. 10 is a cross sectional view of a first semiconductor device according to an eighth embodiment of the invention. Referring now to FIG. 10, the first semiconductor device according to the eighth embodiment is a lateral trench-type MOSFET, which includes a plurality of unit devices formed in a p-type substrate 1. Each unit device includes a trench 2, an n⁻-type offset drain region 3 working as a drain drift region, an insulator 4 buried in trench 2, a p-type well region 5, a p-type base region 6, an n⁺-type source region 7, an n⁺-type drain region 8, a gate insulation film 9 made of an oxide, a polycrystalline silicon gate electrode 10, an interlayer insulation film 11, a source electrode 12, a drain electrode 13, a passivation film 14, a mold resin 15 and an electrical conductor 21 working as a field plate.

Trench 2 is in the surface portion of substrate 1. Trench 2 is dug from the surface of substrate 1 and filled with an insulator 4. The n⁻-type offset drain region 3 surrounds trench 2. The p-type well region 5, p-type base region 6 and n⁺-type source region 7 are on the source side of trench 2. The n⁺-type drain region 8 is on the drain side of trench 2. Gate electrode 10 on gate insulation film 9 is extended onto trench 2. Source electrode 12 and drain electrode 13 on interlayer insulation film 11 are extended above trench 2. Passivation film 14 covers gate electrode 10, source electrode 12 and drain electrode 13. Mold resin 15 protects the entire device structure described above. The configuration described above is the same with that of the semiconductor device according to the first embodiment. Electrical conductor 21 is in insulator 4 buried in trench 2 such that electrical conductor 21 is spaced apart from the side face and the bottom face of trench 2. In other words, electrical conductor 21 is spaced apart from n⁻-type offset drain region 3. Electrical conductor 21 is connected electrically, for example, to source electrode 12 via a contact means 22 extended through interlayer insulation film 11.

Exemplary, the specific resistance of semiconductor substrate 1 is around 100 $\Omega$cm. Trench 2 is 20 $\mu$m in width and 20 $\mu$m in depth. The side face of trench 2 is at right angles with the substrate surface. Electrical conductor 21 is made, for example, of polycrystalline silicon. Electrical conductor 21 is spaced apart for around 4 $\mu$m from the side face of trench 2 on the source side, for 15 $\mu$m from the side face of trench 2 on the drain side and for around 10 from the bottom face of trench 2. The surface impurity concentration of n⁻-type offset drain region 3 is from $5\times10^{15}$ cm⁻³ to $5\times10^{16}$ cm⁻³. The n⁻-type offset drain region 3 is around 6 μm in depth. The extension of gate electrode 10 onto trench 2 is 2 μm. The extension of source electrode 12 above trench 2 is 10 μm. The extension of drain electrode 13 above trench 2 is 5 μm. The breakdown voltage of the semiconductor device structured as described above is around 700 V.

In the first semiconductor device according to the eighth embodiment structured as described above, the electric field is prevented from localizing to the portion of n⁻-type offset drain region 3 in the vicinity of the side face of trench 2 on the source side, since the portion of n⁻-type offset drain region 3 in the vicinity of the side face of trench 2 on the source side is depleted due to the field plate effect of electrical conductor 21. The device pitch is around 40 μm based on the above described dimensions of the constituent elements. The n⁻-type offset drain region 3 can be doped heavily considering the field plate effect. Therefore, the on-resistance per a unit area of the first semiconductor device according to the eighth embodiment is about half the on-resistance per a unit area of the conventional semiconductor device by virtue of the reduced device pitch and the heavily doped n⁻-type offset drain region 3.

Figure 17:
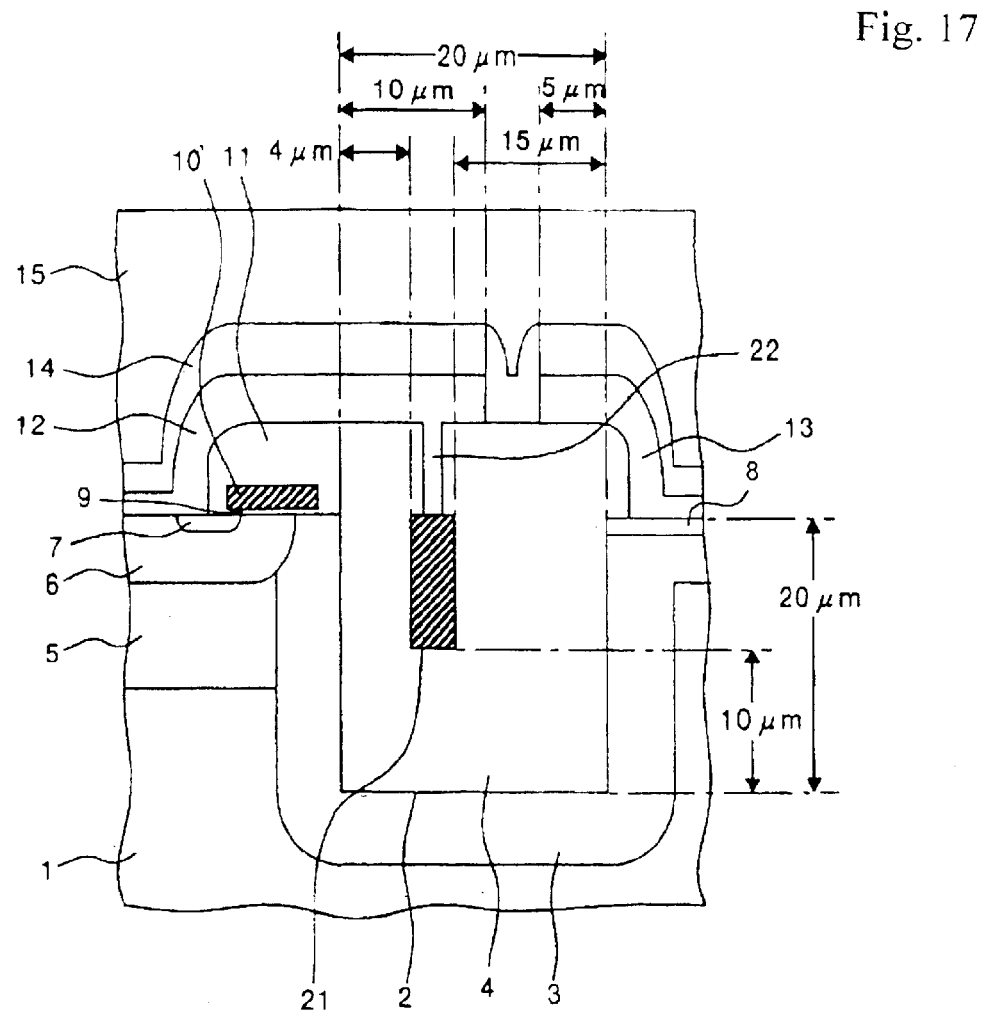
FIG. 17 is a cross sectional view of a second semiconductor device according to the eighth embodiment of the invention.

FIG. 17 is a cross sectional view of a second semiconductor device according to the eighth embodiment of the invention. Since the electric field is prevented from localizing by the field plate effect of electrical conductor 21, gate electrode 10' not extended onto trench 2 poses no problem.

Now the method of manufacturing the first semiconductor device according to the eighth embodiment shown in FIG. 10 will be described below. A p-type well region 5 and a trench 2 are formed in the surface portion of a semiconductor substrate 1. Polycrystalline silicon doped with an n-type impurity is deposited in trench 2. An n⁻-type offset drain region 3 is formed by diffusing the n-type impurity from the polycrystalline silicon. Then, the polycrystalline silicon in trench 2 is removed by etching and an insulator 4 is deposited in trench 2. The steps described so far are the same with the steps for manufacturing the semiconductor device according to the first embodiment. Then, a trench, 1 μm in width and 10 μm in depth, is dug in the surface portion of insulator 4 by the photo-etching technique. The trench is filled with polycrystalline silicon to form an electrical conductor 21.

A gate insulation film 9 is formed. Polycrystalline silicon is deposited on gate insulation film 9 and a gate electrode 10 is formed by etching the deposited polycrystalline silicon. A p-type base region 6 and an n⁺-type source region 7 are formed in the surface portion of p-type well region 5 by the self-alignment technique using the peripheral portion of gate electrode 10 on the source side. An n⁺-type drain region 8 is formed at the same time with or independently of n⁺-type source region 7 in the surface portion of n⁻-type offset drain region 3 on the other side (drain side) of trench 2. An interlayer insulation film 11 is deposited and a contact hole is bored through the deposited interlayer insulation film 11. Then, a source electrode 12 is formed such that source electrode 12 is extended for 10 μm above trench 2. The metal deposited for forming source electrode 12 is deposited also in the contact hole. The metal layer in the contact hole forms a contact means 22, which connects source electrode 12 and electrical conductor 21 electrically.

A drain electrode 13 is formed such that drain electrode 13 is extended for 5 μm above trench 2. Finally, a passivation film 14 is formed on the semiconductor structure formed as described above by depositing a nitride film by plasma deposition, and the semiconductor structure with passivation film 14 deposited thereon is sealed in a mold resin. The first semiconductor device according to the eighth embodiment is manufactured by adding the steps of forming trench 2, filling trench 2 with insulator 4, boring a trench in insulator 4, and filling the trench with an electrical conductor to the steps for manufacturing the conventional lateral MOSFET. Thus, the first semiconductor device according to the eighth embodiment is manufactured without employing any difficult step.

The semiconductor devices according to the eighth embodiment of the invention exhibit a high breakdown voltage of 700 V, since the electric field inside the semiconductor devices is relaxed due to the provision of electrical conductor 21 working as a field plate. Since offset drain region 3 can be doped heavily by virtue of the field plate effect, the semiconductor devices according to the eighth embodiment facilitate reducing the tradeoff relation between the breakdown voltage and the on-resistance per a unit area. According the eighth embodiment, a semiconductor device exhibiting a high breakdown voltage of 700 V is obtained without greatly increasing the manufacturing steps thereof. Since the spacing between source electrode 12 and drain electrode 13 above trench 2 is narrowed to 5 μm according the eighth embodiment, the ions in mold resin 15 are prevented from adversely affecting n⁻-type offset drain region 3.

Figure 11:
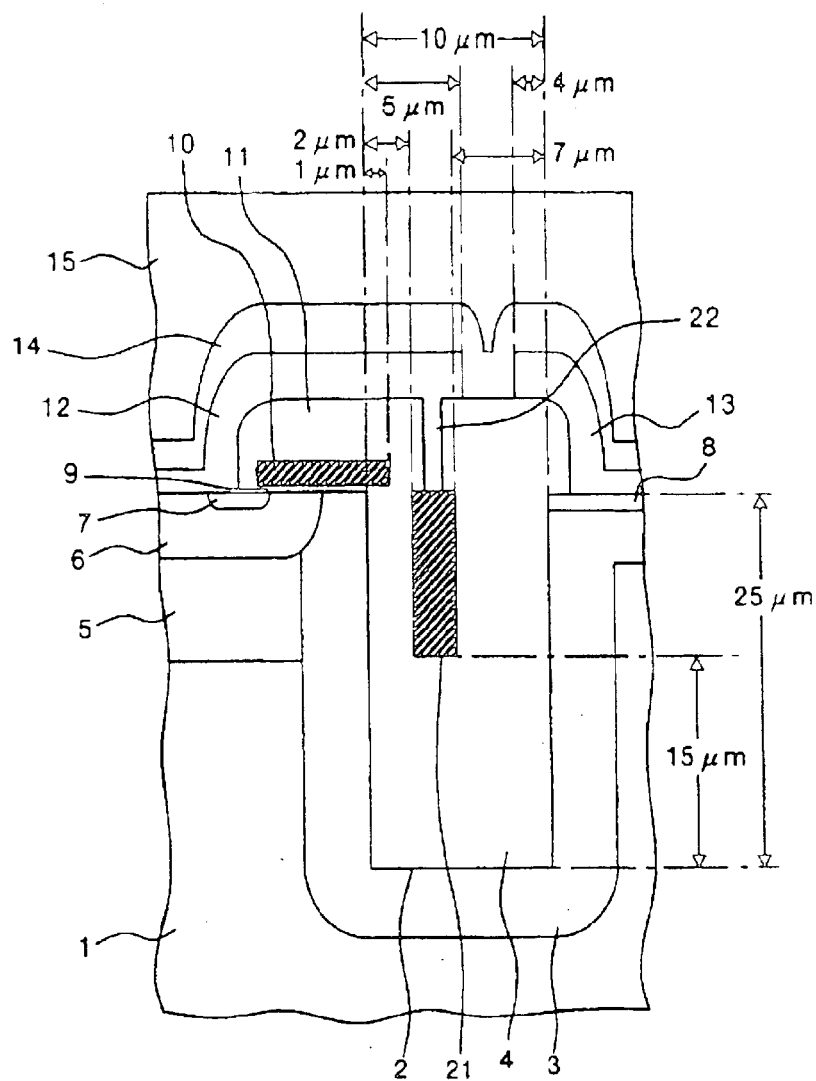
FIG. 11 is a cross sectional view of a third semiconductor device according to the eighth embodiment of the invention.

FIG. 11 is a cross sectional view of a third semiconductor device according to the eighth embodiment of the invention. The structure of the third semiconductor device according to the eighth embodiment is essentially the same with that of the second semiconductor device according to the eighth embodiment except for the parameters of the constituent elements thereof.

In detail, the specific resistance of semiconductor substrate 1 is around 100 Ωcm. Trench 2 is 10 μm in width and 25 μm in depth. The side face of trench 2 is at right angles with the substrate surface. Electrical conductor 21 is spaced apart for around 2 μm from the side face of trench 2 on the source side, for 7 μm from the side face of trench 2 on the drain side and for around 15 from the bottom face of trench 2. The surface impurity concentration of n-type offset drain region 3 is from $5\times10^{15}$ cm³ to $5\times10^{16}$ cm³. The n⁻-type offset drain region 3 is around 6 μm in depth. The extension of gate electrode 10 onto trench 2 is 1 μm. The extension of source electrode 12 above trench 2 is 5 μm. The extension of drain electrode 13 above trench 2 is 4 μm. The breakdown voltage of the semiconductor device structured as described above is around 700 V. The device pitch is 30 μm. Therefore, the third semiconductor device according to the eighth embodiment facilitates reducing the on-resistance per a unit area to one third the on-resistance per a unit area of the conventional lateral MOSFET without impairing the breakdown voltage of 700 V.

Ninth Embodiment

Figure 12:
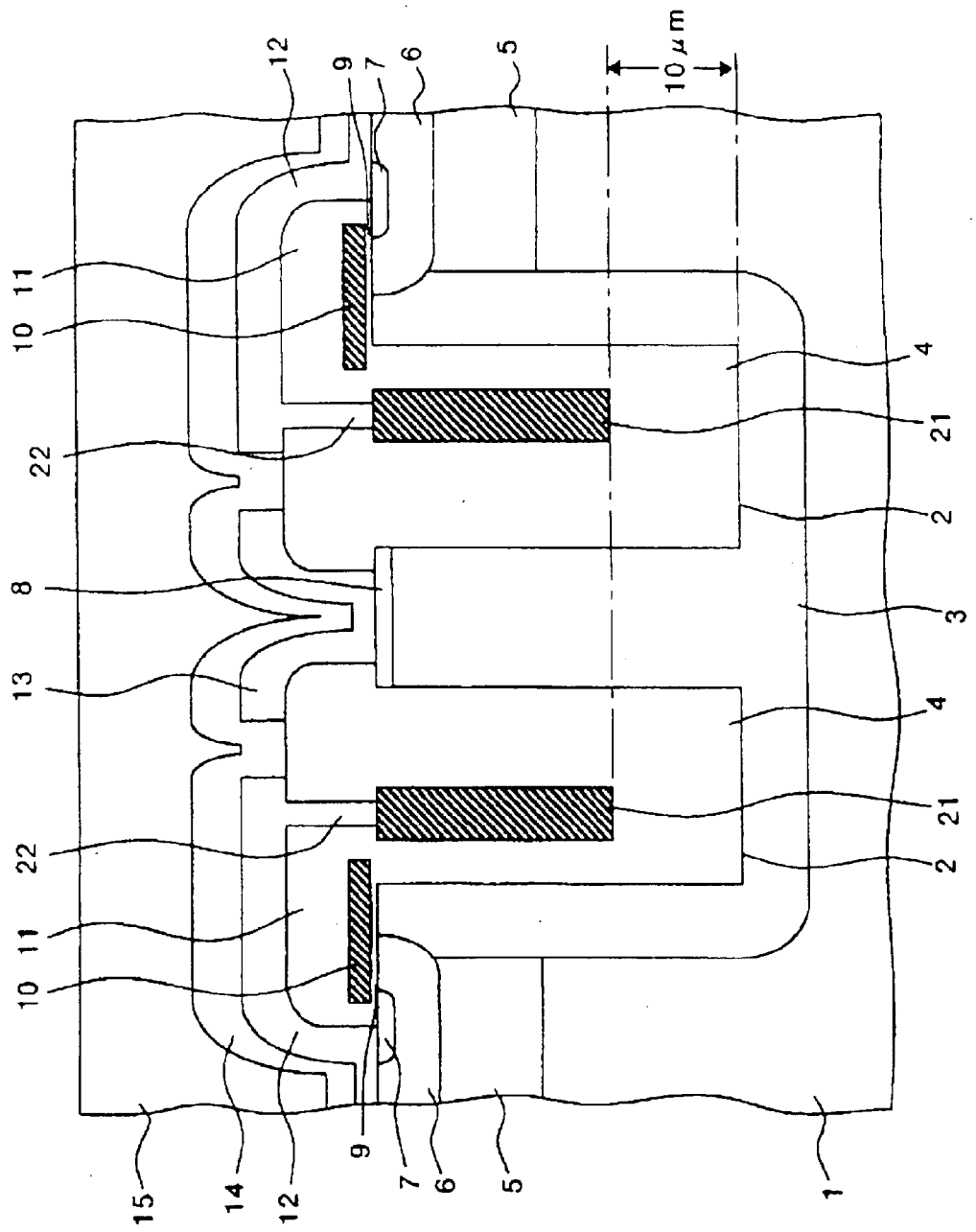
FIG. 12 is a cross sectional view of a semiconductor device according to a ninth embodiment of the invention.

FIG. 12 is a cross sectional view of a semiconductor device according to a ninth embodiment of the invention. Referring now to FIG. 12, only an n⁻-type offset drain region 3 exists between the side faces of adjacent trenches 2 and 2 on the drain side. In contrast, an n⁻-type offset drain region 3 and a semiconductor substrate 1 exist between the side faces of adjacent trenches 2 and 2 on the drain side in the semiconductor device according to the eighth embodiment.

Exemplary, trench 2 is 10 μm in width and 25 μm in depth. Exemplary, the side face of trench 2 is extended at right angles with the substrate surface. Electrical conductor 21 is spaced apart for 2 μm from the side face of trench 2 on the source side, for 7 μm from the side face of trench 2 on the drain side and for 10 μm from the bottom face of trench 2. Exemplary, gate electrode 10 is extended for 1 μm onto trench 2, source electrode 12 for 5 μm above trench 2, and drain electrode 13 for 4 μm above trench 2. Since the structures other than the structure below the drain electrode of the semiconductor device according to the ninth embodiment are the same with those of the semiconductor device according to the eighth embodiment, the same reference numerals as used in describing the semiconductor device according to the eighth embodiment are used to designated the same constituent elements and their duplicated explanations are omitted for the sake of simplicity.

The semiconductor device according to the ninth embodiment exhibits the same effects as the semiconductor device according to the eighth embodiment does. In addition, the semiconductor device according to the ninth embodiment exhibits the following additional effects.

When a pair of unit devices are arranged side by side in a mirror symmetry, the portion of n⁻-type offset drain region 3 beneath n⁺-type drain region 8 is between two trenches 2 and 2. Electrical conductors 21 and 21 working as field plates are connected electrically to respective source electrodes 12 and 12. Due to the configuration described above, the portion of n⁻-type offset drain region 3 beneath n⁺-type drain region 8 is depleted from the both sides thereof. Since the portion of n⁻-type offset drain region 3 beneath n⁺-type drain region 8 can be doped more heavily by virtue of the mechanism described above, the on-resistance is further reduced. Since depletion layer expansion is facilitated also in the portion of n⁻-type offset drain region 3 on the source side, the portion of n⁻-type offset drain region 3 on the source side can be doped more heavily.

Tenth Embodiment

Figure 13:
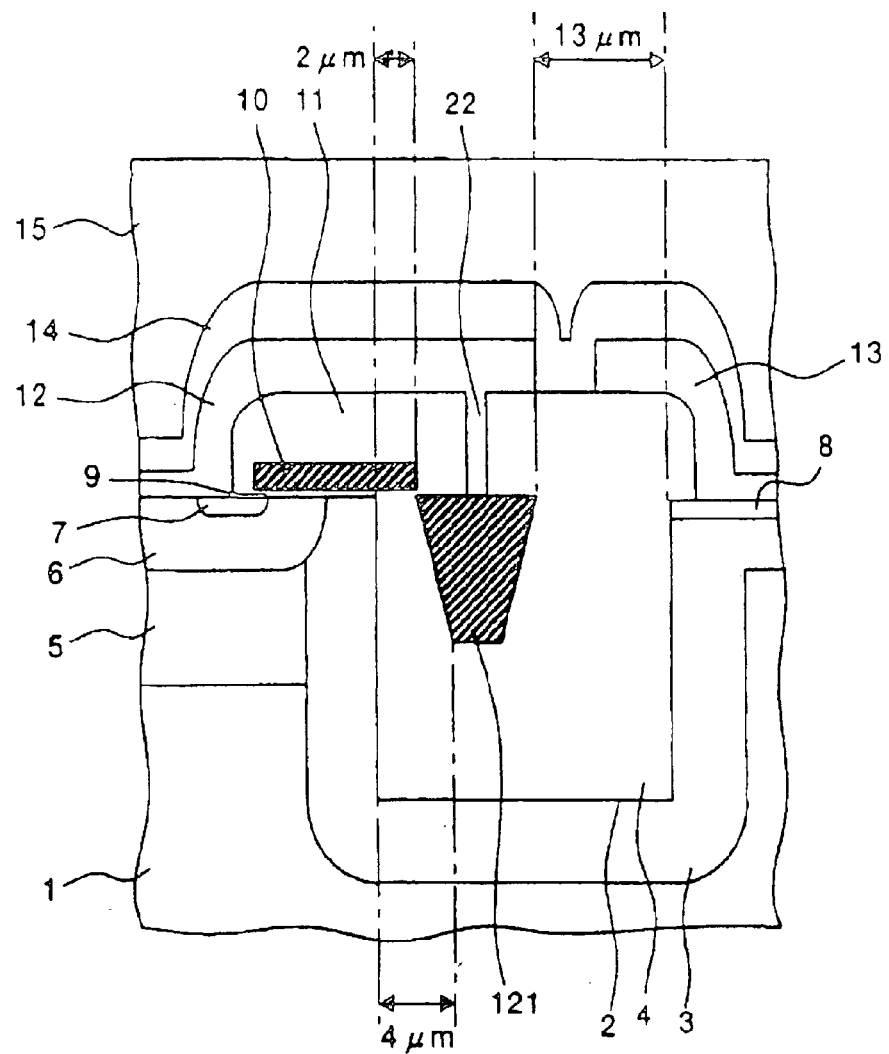
FIG. 13 is a cross sectional view of a semiconductor device according to a tenth embodiment of the invention.

FIG. 13 is a cross sectional view of a semiconductor device according to a tenth embodiment of the invention. Referring now to FIG. 13, the unit device of the semiconductor device according to the tenth embodiment includes a trapezoidal electrical conductor 121 working as a field plate in substitution for electrical conductor 21 working as a field plate according to the eighth embodiment of the invention. Trapezoidal electrical conductor 121 is formed such that the lower end thereof is shorter. Exemplary, trench 2 is 20 μm in width and 20 μm in depth. Exemplary, the side face of trench 2 is extended at right angles with the substrate surface. The upper end of electrical conductor 121 is spaced apart for 2 μm from the side face of trench 2 on the source side and for 13 μm from the side face of trench 2 on the drain side. The lower end of electrical conductor 121 is spaced apart for 4 μm from the side face of trench 2 on the source side. Electrical conductor 121 is space apart for 10 μm from the bottom face of trench 2. Exemplary, gate electrode 10 is extended for 2 μm onto trench 2, source electrode 12 for 10 μm above trench 2, and drain electrode 13 for 5 μm above trench 2. Since the structures other than the field plate electrical conductor of the semiconductor device according to the tenth embodiment are the same with those of the semiconductor device according to the eighth embodiment, the same reference numerals as used in describing the semiconductor device according to the eighth embodiment are used to designated the same constituent elements and their duplicated explanations are omitted for the sake of simplicity.

The semiconductor device according to the tenth embodiment exhibits the same effect as the semiconductor device according to the eighth embodiment does. In addition, electrical conductor 121 which narrows toward the lower end thereof facilitates relaxing the electric field in the source side peripheral portion of n⁻-type offset drain region 3.

Eleventh Embodiment

Figure 14:
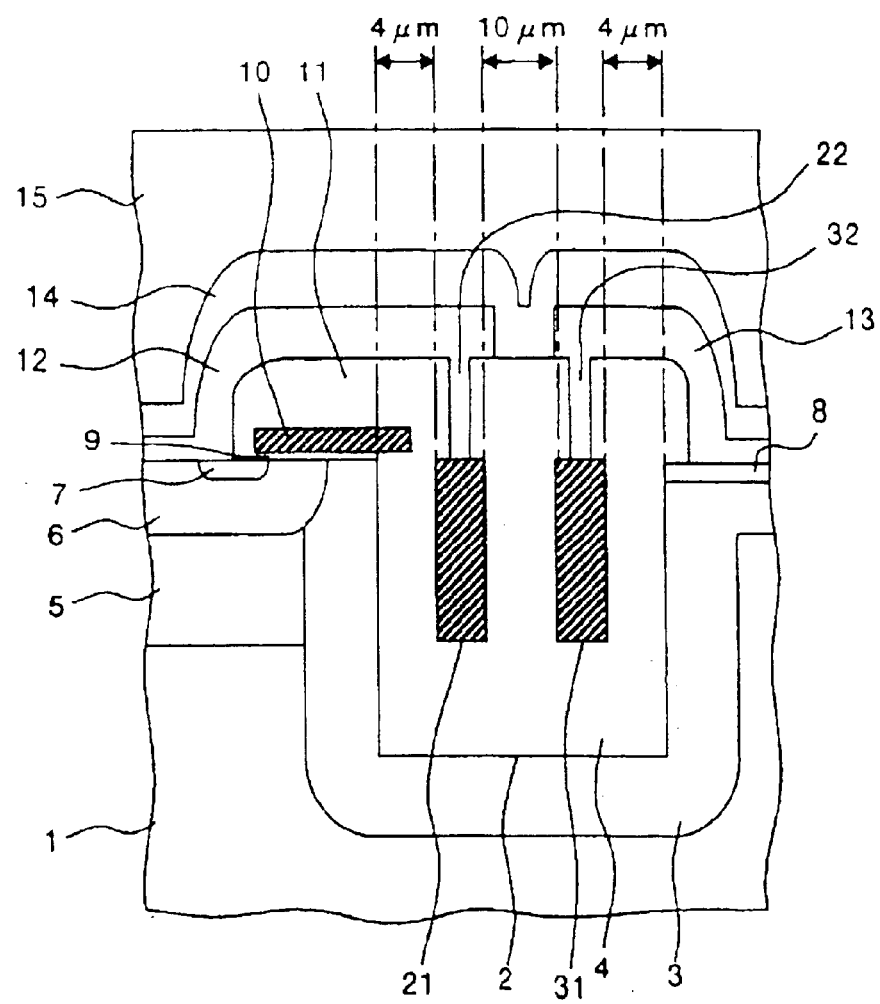
FIG. 14 is a cross sectional view of a semiconductor device according to an eleventh embodiment of the invention.

FIG. 14 is a cross sectional view of a semiconductor device according to an eleventh embodiment of the invention. Referring now to FIG. 14, the semiconductor device according to the eleventh embodiment includes a second electrical conductor 31 in insulator 4 filling trench 2 in addition to the constituent elements which the semiconductor device according to the eighth embodiment includes. Electrical conductor 31 working as a field plate is connected electrically to drain electrode 13 through a second contact means 32. Exemplary, trench 2 is 20 μm in width and 20 μm in depth. The side face of trench 2 is extended at right angles with the substrate surface. Electrical conductor 21 connected to source electrode 12 is spaced apart for 4 μm from the side face of trench 2 on the source side and for 10 μm from the bottom face of trench 2.

Electrical conductor 31 working as a second field plate is spaced apart for 4 μm from the side face of trench 2 on the drain side and for 10 μm from the bottom face of trench 2. Electrical conductors 21 and 31 are spaced apart for 10 μm from each other. Gate electrode 10 is extended for 2 μm onto trench 2, source electrode 12 for 10 μm above trench 2, and drain electrode 13 for 5 μm above trench 2. Since the structures other than the provision of the second electrical conductor in the semiconductor device according to the eleventh embodiment are the same with those of the semiconductor device according to the eighth embodiment, the same reference numerals as used in describing the semiconductor device according to the eighth embodiment are used to designated the same constituent elements and their duplicated explanations are omitted for the sake of simplicity.

The semiconductor device according to the eleventh embodiment exhibits the same effect as the semiconductor device according to the eighth embodiment does. In addition, second electrical conductor 31 connected electrically to drain electrode 13 facilitates relaxing the electric field in the peripheral portion of n⁺-type drain region 8.

Twelfth Embodiment

Figure 15:
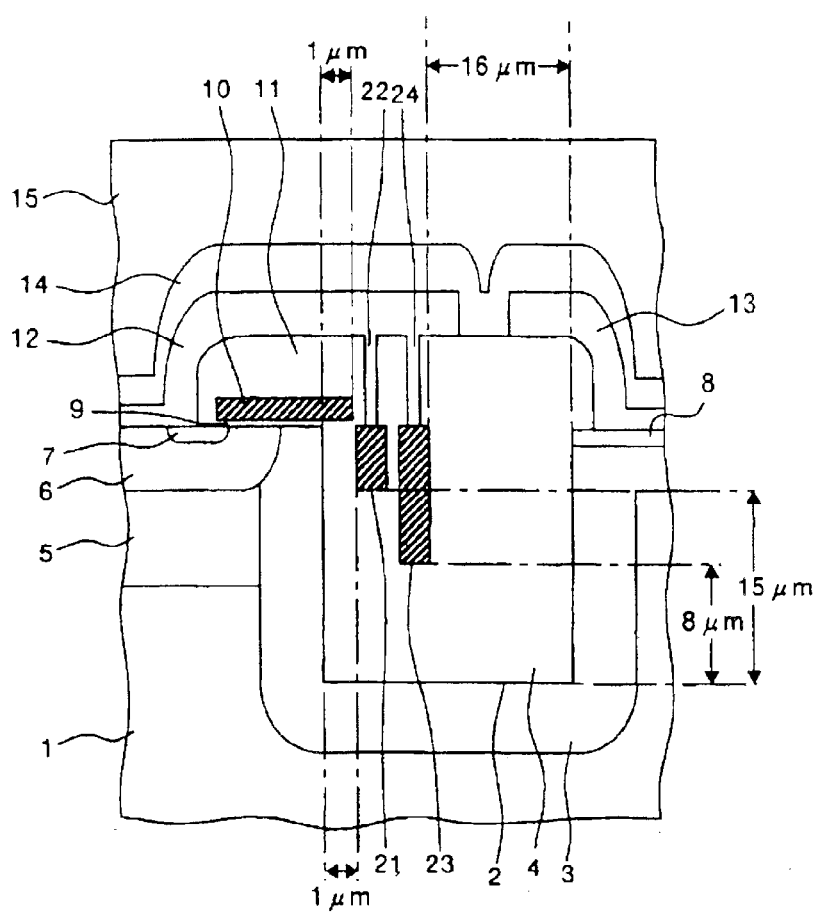
FIG. 15 is a cross sectional view of a semiconductor device according to a twelfth embodiment of the invention.

FIG. 15 is a cross sectional view of a semiconductor device according to a twelfth embodiment of the invention. Referring now to FIG. 15, the semiconductor device according to the twelfth embodiment includes a third conductor 23 in insulator 4 filling trench 2 in addition to the constituent elements which the semiconductor device according to the eighth embodiment includes. Third electrical conductor 23 working as a field plate is connected electrically to source electrode 13 through a third contact means 24. Broadly describing, the semiconductor device according to the twelfth embodiment includes a plurality of electrical conductors (two in FIG. 15) working as field plates connected electrically to source electrode 12. Electrical conductor 21, positioned more closely than electrical conductor 23 to the source side, is spaced apart more widely from the bottom of trench 2. Exemplary, trench 2 is 20 μm in width and 20 μm in depth. The side face of trench 2 is extended at right angles with the substrate surface.

Electrical conductor 21 connected to source electrode 12 is spaced apart for 1 μm from the side face of trench 2 on the source side and for 15 μm from the bottom face of trench 2. Third electrical conductor 23 positioned on the central side of trench 2 is spaced apart for 16 μm from the side face of trench 2 on the drain side and for 8 μm from the bottom face of trench 2. Gate electrode 10 is extended for 1 μm onto trench 2, source electrode 12 for 10 μm above trench 2, and drain electrode 13 for 5 μm above trench 2. Since the structures other than the provision of the third electrical conductor in the semiconductor device according to the twelfth embodiment are the same with those of the semiconductor device according to the eighth embodiment, the same reference numerals as used in describing the semiconductor device according to the eighth embodiment are used to designated the same constituent elements and their duplicated explanations are omitted for the sake of simplicity.

The semiconductor device according to the twelfth embodiment exhibits the same effect as the semiconductor device according to the eighth embodiment does. In addition, since the double field plate structure formed of electrical conductors 21 and 23 facilitates positioning the first field plate (electrical conductor 21) in proximity to the side face of trench 2 on the source side, the electric field on the source side and the electric field on the drain side are relaxed effectively.

Thirteen Embodiment

Figure 16:
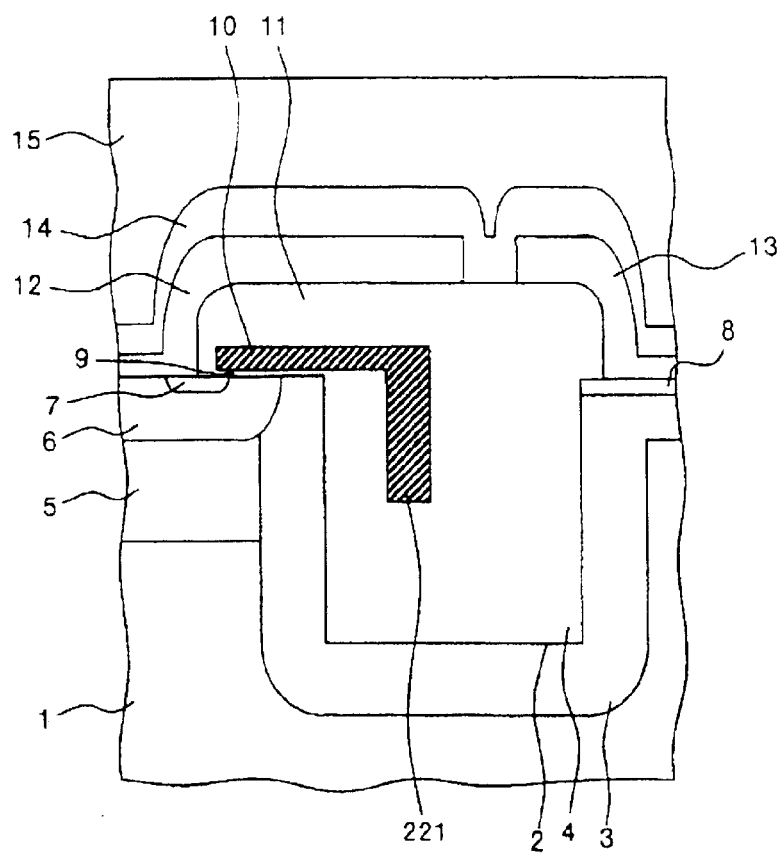
FIG. 16 is a cross sectional view of a semiconductor device according to a thirteenth embodiment of the invention.

FIG. 16 is a cross sectional view of a semiconductor device according to a thirteenth embodiment of the invention. Referring now to FIG. 16, the semiconductor device according to the thirteenth embodiment omits electrical conductor 21 and contact means 22 from the semiconductor device according to the eighth embodiment and buries an electrical conductor 221 working as a field plate in insulator 4 filling trench 2. Electrical conductor 221 is connected to gate electrode 10 electrically. Exemplary, trench 2 is 20 $\mu$m in width and 20 $\mu$m in depth. The side face of trench 2 is extended at right angles with the substrate surface. Electrical conductor 221 is spaced apart for 4 $\mu$m from the side face of trench 2 on the source side, for 15 $\mu$m from the side face of trench 2 on the drain side and for 10 $\mu$m from the bottom face of trench 2. Gate electrode 10 is extended for 2 $\mu$m onto trench 2, source electrode 12 for 10 $\mu$m above trench 2, and drain electrode 13 for 5 $\mu$m above trench 2.

Since the structures other than the provision of the electrical conductor connected to the gate electrode in the semiconductor device according to the thirteenth embodiment are the same with those of the semiconductor device according to the eighth embodiment, the same reference numerals as used in describing the semiconductor device according to the eighth embodiment are used to designated the same constituent elements and their duplicated explanations are omitted for the sake of simplicity. In manufacturing the semiconductor device according to the thirteenth embodiment, electrical conductor 221 is formed simultaneously with gate electrode 10 by depositing polycrystalline silicon for forming gate electrode 10 in the trench dug in insulator 4 filling trench 2.

The semiconductor device according to the thirteenth embodiment exhibits the same effect as the semiconductor device according to the eighth embodiment does. In addition, since polycrystalline silicon electrical conductor 221 is formed simultaneously with gate electrode 10, it is unnecessary to add a step of forming electrical conductor 221. Therefore, the semiconductor device according to the thirteenth embodiment facilitates simplifying the process for manufacturing the semiconductor device according to the invention.

Since the source electrode and the drain electrode according to the invention work as a field plate, the electric field inside the semiconductor device according to the invention is relaxed and a high breakdown voltage is obtained. Since the offset drain region can be doped heavily by virtue of the field plate effect, the tradeoff relation between the breakdown voltage and the on-resistance per a unit area is reduced. Since the spacing between the source electrode and the drain electrode above the trench is narrowed according to the invention, the ions in the mold resin are prevented from adversely affecting the device characteristics. Since the semiconductor device according to the invention is manufactured by adding the steps of forming the trench and filling the trench with an insulator to the steps for manufacturing the conventional lateral DMOSFET, a semiconductor structure for constituting a lateral trench-type MOSFET exhibiting a high breakdown voltage of 200 V or higher is obtained without greatly increasing the manufacturing steps.

Since the electrical conductor buried in the insulator filling the trench works as a field plate according to another aspect of the invention, the breakdown voltage in the OFF-state of the device is improved. Since the offset drain region can be doped heavily by virtue of the provision of the field plate, the tradeoff relation between the breakdown voltage and the on-resistance per a unit area is reduced. Since the semiconductor device according to the invention is manufactured by adding the steps of forming the trench, filling the trench with an insulator, forming a trench in the insulator, and filling the trench with an electrical conductor to the steps for manufacturing the conventional lateral DMOSFET, a semiconductor structure for constituting a lateral trench-type MOSFET exhibiting a high breakdown voltage of 200 V or higher is obtained without greatly increasing the manufacturing steps.

Although the invention has been described in connection with the embodiments thereof, changes and modification are obvious to those skilled in the art without departing from the true spirit of the invention. Therefore, the invention be understood not by the specific disclosures herein but by the appended claims thereof. For example, any of the semiconductor structure according to the first through seventh embodiments may be combined with any of the semiconductor structure according to the eighth through thirteenth embodiments. In the semiconductor structures according to the first through seventh embodiments, the side face of the trench may not always be extended at 60 degrees of angle, at 75 degrees of angle or at 90 degrees of angle with the substrate surface. Alternatively, the side face of the trench may be extended at any angle between 30 degrees of angle and 90 degrees of angle.

What is claimed is:

1. A semiconductor device comprising:
  a semiconductor substrate of a first conductivity type;
  a plurality of unit devices in the semiconductor substrate; each of the unit devices comprising
  a source region of a second conductivity type in the surface portion of the semiconductor substrate;
  a drain region of the second conductivity type in the surface portion of the semiconductor substrate spaced apart from the source region;
  a trench extending from the surface of the semiconductor substrate between the source region and the drain region and spaced apart from the source region;
  an insulator in the trench;
  a drain drift region of the second conductivity type surrounding a side face and a bottom face of the trench and spaced apart from the source region;
  a gate insulation film on the surface of the semiconductor substrate between the source region end the drain drift region;
  a gate electrode on the gate insulation film, the gate electrode being extended onto the trench;
  a source electrode connected electrically to the source region;

a drain electrode connected electrically to the drain region; and wherein the side face of the french is extended at an angle between 30 degrees and less than 90 degrees with respect to the surface of the semiconductor substrate.

2. A semiconductor device comprising:

a semiconductor substrate of a first conductivity type;

a plurality of unit devices in the semiconductor substrate;

each of the unit devices comprising a source region of a second conductivity type in the surface portion of the semiconductor substrate;

a drain region of the second conductivity type in the surface portion of the semiconductor substrate spaced apart from the source region;

a trench extending from the surface of the semiconductor substrate between the source region and the drain region and spaced apart from the source region;

an insulator in the trench;

a drain drift region of the second conductivity type surrounding a side face and a bottom face of the trench and spaced apart from the source region;

a gate insulation film on the surface of the semiconductor substrate between the source region and the drain drift region;

a gate electrode on the gate insulation film, the gate electrode being extended onto the trench;

a source electrode connected electrically to the source region;

a drain electrode connected electrically to the drain region;

wherein the side face of the trench is extended at an angle between 30 degrees and 90 degrees with respect to the surface of the semiconductor substrate; and wherein the source electrode and the drain electrode are extended above the trench.

3. The semiconductor device according to claim 1, wherein the unit device further comprises a base region of the first conductivity type surrounding the source region.

4. The semiconductor device according to claim 1, wherein the unit device further comprises an epitaxial growth layer of the first conductivity type surrounding the drain drift region.

5. The semiconductor device according to claim 1 wherein the unit device further comprises a well region of the first conductivity type surrounding the drain drift region.

6. A semiconductor device comprising:

a semiconductor substrate of a first conductivity type;

a plurality of unit devices in the semiconductor substrate;

each of the unit devices comprising a source region of a second conductivity type in the surface portion of the semiconductor substrate;

a drain region of the second conductivity type in the surface portion of the semiconductor substrate spaced apart from the source region;

a trench extending from the surface of the semiconductor substrate between the source region and the drain region and spaced apart from the source region;

an insulator in the trench;

a drain drift region of the second conductivity type surrounding a side face and the bottom face of the trench and spaced apart from the source region;

a gate insulation film on the surface of the semiconductor substrate between the source region and the drain drift region;

a gate electrode on the rate insulation film, the gate electrode being extended onto the trench;

a source electrode connected electrically to the source region;

a drain electrode connected electrically to the drain region; and an electric field relaxation layer of the first conductivity type between the drain drift region and the insulator in the trench;

wherein the side face of the trench is extended at an angle between 30 degrees and 90 degrees with respect to the surface of the semiconductor substrate.

7. A semiconductor device comprising:

a semiconductor substrate of a first conductivity type;

a plurality of unit devices in the semiconductor substrate;

each of the unit devices comprising a source region of a second conductivity type in the surface portion of the semiconductor substrate;

a drain region of the second conductivity type in the surface portion of the semiconductor substrate spaced apart from the source region;

a trench extending from the surface of the semiconductor substrate between the source region and the drain region and spaced apart from the source region;

an insulator in the trench;

a first electrical conductor in the insulator the first electrical conductor working as a first field plate, the first electrical conductor being spaced apart from a side face and a bottom face of the trench;

a drain drift region of the second conductivity type surrounding the side face and the bottom face of the trench and spaced apart from the source region;

a gate insulation film on the surface of the semiconductor substrate between the source region and the drain drift region;

a gate electrode on the gate insulation film;

a source electrode connected electrically to the source region; and a drain electrode connected electrically to the drain region.

8. The semiconductor device according to claim 7, wherein the gate electrode is extended onto the trench.

9. The semiconductor device according to claim 7, wherein the source electrode end the drain electrode are extended above the trench.

10. The semiconductor device according to claim 7, wherein the unit device further comprises a base region of the first conductivity type surrounding the source region.

11. The semiconductor device according to claim 7, wherein the first electrical conductor working as a field plate is connected electrically to the source electrode.

12. The semiconductor device according to claim 7, wherein the first electrical conductor working as a field plate is connected electrically to the gate electrode.

13. The semiconductor device according to claim 7, wherein the thickness of the insulator between the first electrical conductor and the side face of the trench on the source side is thinner than the thickness of the insulator between the first electrical conductor and the bottom face of the trench, and the thickness of the insulator between the first electrical conductor and the bottom face of the trench is thinner than the thickness of the insulator between the first electrical conductor and the side face of the trench on the drain side.

14. The semiconductor device according to claim 7, wherein the thickness of the mutilator between the first electrical conductor and the side face of the trench on the source side becomes thicker toward the bottom of the trench.

15. The semiconductor device according to claim 7, wherein the unit device further comprises a second electrical conductor in the insulator on the drain side, the second electrical conductor working as a second field plate, the second electrical conductor being spaced apart from the side face of the trench, the bottom face of the trench and the first electrical conductor, and the second electrical conductor being connected electrically to the drain electrode.

16. The semiconductor device according to claim 7, wherein the unit device further comprises one or more electrical conductors in the insulator, the electrical conductors being separated from each other; each of the one or more electrical conductors working as a field plate; the one or more electrical conductors being spaced apart from the side face of the trench, the bottom face of the trench and the first electrical conductor and the electrical conductor positioned more closely to the side face of the trench is spaced apart more widely from the bottom face of the trench than the electrical conductor positioned more closely to the center of the trench.

17. The semiconductor device according to claim 15, wherein the unit device further comprises one or more electrical conductors in the insulator, the electrical conductors being separated from each other; each of the one or more electrical conductors working as a field plate; the one or mare electrical conductors being spaced apart from the side face of the trench, the bottom face of the trench, the first electrical conductor and the second electrical conductor, and the electrical conductor positioned more closely to the side face of the trench is spaced apart more widely from the bottom face of the trench than the electrical conductor positioned more closely to the center of the trench.

18. The semiconductor device according to claim 7, wherein the first electrical conductor is made of an electrically conductive material deposited in a second trench formed by etching the insulator.

19. The semiconductor device according to claim 15, wherein the second electrical conductor is made of an electrically conductive material deposited in a second trench formed by etching the insulator.

20. The semiconductor device according to claim 16, wherein the one or more electrical conductors are made of an electrically conductive material deposited in one or more trenches formed by etching the insulator.

21. The semiconductor device according to claim 17, wherein the one or more electrical conductors are made of an electrically conductive material deposited in one or more trenches formed by etching the insulator.

22. A semiconductor device comprising:
a semiconductor substrate of a first conductivity type;
a plurality of unit devices in the semiconductor substrate;
each of the unit devices comprising
a source region of a second conductivity type in the surface portion of the semiconductor substrate;
a drain region of the second conductivity type in the surface portion of the semiconductor substrate spaced apart from the source region;
a trench extending from the surface of the semiconductor substrate between the source region and the drain region and spaced apart from the source region;
an insulator in the trench;
a first electrical conductor in the insulator, the first electrical conductor working as a first field plate, the first electrical conductor being spaced apart from a side face and a bottom face of the trench;
a drain drift region of the second conductivity surrounding the side face and the bottom face of the trench and spaced apart from the source region;
a gate insulation film on the surface of the semiconductor substrate between the source region and the drain drift region;
a gate electrode on the gate insulation film;
a source electrode connected electrically to the source region;
a drain electrode connected electrically to the drain region; and
the side face of the trench being extended at an angle from 30 degrees to 90 degrees with respect to the surface of the semiconductor substrate.

23. The semiconductor device according to claim 22, wherein the gate electrode is extended onto the trench.

24. The semiconductor device according to claim 22, wherein the source electrode and the drain electrode are extended above the trench.

25. The semiconductor device according to claim 22, wherein the first electrical conductor working as a field plate is connected electrically to the source electrode.

26. The semiconductor device according to claim 22, wherein the first electrical conductor working as a field plate is connected electrically to the gate electrode.

27. The semiconductor device according to claim 22, wherein the unit device further comprises a second electrical conductor in the insulator on the drain side, the second electrical conductor working as a second field plate, the second electrical conductor being spaced apart from the side face of the trench, the bottom face of the trench and the first electrical conductor, and the second electrical conductor being connected electrically to the drain electrode.

28. A semiconductor device according to claim 1, wherein the side face of the trench is extended at an angle of 60 degrees with respect to the surface of the semiconductor substrate.

29. A semiconductor device according to claim 1, wherein the side face of the trench is extended at an angle of 75 degrees with respect to the surface of the semiconductor substrate.

30. A semiconductor device comprising:
a semiconductor substrate of a first conductivity type;
a plurality of unit devices in the semiconductor substrate;
each of the unit devices comprising
a source region of a second conductivity type in the surface portion of the semiconductor substrate;
a drain region of the second conductivity type in the surface portion of the semiconductor substrate spaced apart from the source region;
a trench extending from the surface of the semiconductor substrate between the source region and the drain region and spaced apart from the source region;
an insulator in the trench;
a drain drift region of the second conductivity type surrounding a side face and the bottom face of the trench and spaced apart from the source region;
a gate insulation film on the surface of the semiconductor substrate between the source region and the drain drift region;

a gate electrode on the gate insulation film, the gate electrode being extended onto the trench;

a source electrode connected electrically to the source region; and a drain electrode connected electrically to the drain region;

wherein the side face of the trench is extended at an angle between 30 degrees and 90 degrees with respect to the surface of the semiconductor substrate; and wherein the depth of the trench extends further than the well region.

* * * * *